United States Patent
Lee

(10) Patent No.: US 12,444,642 B2
(45) Date of Patent: Oct. 14, 2025

(54) ROBOTIC ARM AND APPARATUS FOR TREATING SUBSTRATE INCLUDING THE SAME

(71) Applicant: SEMES CO., LTD., Chungcheongnam-do (KR)

(72) Inventor: Tae Hoon Lee, Chungcheongnam-do (KR)

(73) Assignee: SEMES CO., LTD., Chungcheongnam-do (KR)

(*) Notice: Subject to any disclaimer, the term of this patent is extended or adjusted under 35 U.S.C. 154(b) by 378 days.

(21) Appl. No.: 18/086,633

(22) Filed: Dec. 21, 2022

(65) Prior Publication Data

US 2023/0317504 A1 Oct. 5, 2023

(30) Foreign Application Priority Data

Mar. 29, 2022 (KR) .................. 10-2022-0039000

(51) Int. Cl.
| | |
|---|---|
| H01L 21/687 | (2006.01) |
| B25J 11/00 | (2006.01) |
| B25J 18/00 | (2006.01) |
| H01L 21/677 | (2006.01) |
| H01L 21/683 | (2006.01) |

(52) U.S. Cl.
CPC ..... *H01L 21/68707* (2013.01); *B25J 11/0095* (2013.01); *B25J 18/00* (2013.01); *H01L 21/67742* (2013.01); *H01L 21/67766* (2013.01); *H01L 21/6838* (2013.01)

(58) Field of Classification Search
CPC ............. H01L 21/68707; B25J 11/0095
See application file for complete search history.

(56) References Cited

U.S. PATENT DOCUMENTS

| | | |
|---|---|---|
| 2018/0033661 A1 | 2/2018 | Lee et al. |
| 2019/0355605 A1* | 11/2019 | Hudgens ........... H01L 21/67754 |
| 2020/0273681 A1 | 8/2020 | Son et al. |
| 2021/0100141 A1* | 4/2021 | Natu ................ H01L 21/68707 |
| 2021/0347584 A1 | 11/2021 | Hashima et al. |

FOREIGN PATENT DOCUMENTS

| | | |
|---|---|---|
| JP | 2021-180212 | 11/2021 |
| KR | 10-2018-0014327 | 2/2018 |
| KR | 10-1882397 | 7/2018 |
| KR | 10-2020-0102612 | 9/2020 |
| KR | 10-2021-0030726 | 3/2021 |
| KR | 10-2021-0141822 | 11/2021 |

OTHER PUBLICATIONS

Office Action dated Nov. 30, 2023 for Korean Patent Application No. 10-2022-0039000 and its English translation from Global Dossier.

* cited by examiner

*Primary Examiner* — Scott Bauer
(74) *Attorney, Agent, or Firm* — WOMBLE BOND DICKINSON (US) LLP

(57) ABSTRACT

Provided is a robotic arm includes an arm body; and a plurality of pads connected to the arm body and in contact with a substrate, wherein the arm body includes a ceramic plate and an antistatic coating layer disposed on an external surface of the ceramic plate, wherein the pad includes a first conductive layer, and wherein a conductive portion connecting the pad to the antistatic coating layer on an external side of the pad is provided.

19 Claims, 10 Drawing Sheets

ROBOTIC ARM AND APPARATUS FOR TREATING SUBSTRATE INCLUDING THE SAME

CROSS-REFERENCE TO RELATED APPLICATIONS

This application claims benefit of priority to Korean Patent Application No. 10-2022-0039000 filed on Mar. 29, 2022 in the Korean Intellectual Property Office, the disclosure of which is incorporated herein by reference in its entirety.

BACKGROUND

Example embodiments of the present disclosure relate to a robotic arm and an apparatus for treating a substrate including the same.

A semiconductor device may be manufactured by forming a multilayer film according to a desired circuit pattern on a single crystal silicon wafer. To this end, a plurality of processes such as a deposition process, a photolithography process, an oxidation process, an etching process, an ion implantation process, and a metal wiring process may be repeatedly performed in operations.

In order for each unit process to be performed according to a procedure, after each process is completed, a wafer may be transferred from equipment to which a subsequent process is to be performed or from the same equipment to another position. In this case, each wafer may be individually transferred, or a plurality of wafers may be transferred to equipment such as a cassette.

Even when a plurality of wafers are transferred by a cassette, to perform each process, a wafer transfer robot may be used to load or transfer wafers, and this transfer robot may be used by attaching an end effector to a robotic arm. An end-effector may include a blade directly handling a wafer.

In such a blade, a blade formed of a ceramic material may be considered to secure flatness and to reduce vibrations. However, in the case of a blade formed of a ceramic material, electrical conductivity may be low, such that electric charges of a wafer transported from the blade end may not escape and may be accumulated, such that arcing may occur in the charged wafer during an individual process.

SUMMARY

Example embodiments of the present disclosure are to provide a robotic arm including a ceramic plate and having an antistatic path.

Example embodiments of the present disclosure provides a robotic arm and an apparatus for treating a substrate including the same.

According to an example embodiment of the present disclosure, a robotic arm includes an arm body; and a plurality of pads connected to the arm body and in contact with a substrate, wherein the arm body includes a ceramic plate and an antistatic coating layer disposed on an external surface of the ceramic plate, wherein the pad includes a first conductive layer, and wherein a conductive portion connecting the pad to the antistatic coating layer on an external side of the pad is provided.

The pad may include the first layer in contact with a substrate; a second layer disposed below the first layer and formed of a material having elasticity higher than that of the first layer, and a third layer disposed below the second layer and formed of a material having rigidity higher than that of the second layer, the second layer may include conductive silicon, the third layer may be a metal layer, and the antistatic coating layer may include fluororesin.

The ceramic plate may include first and second ceramic plates, an intake flow path may be formed between the first and second ceramic plates, the pad may include a through-hole communicating with the intake flow path, the pad may be connected to the first ceramic plate, and the first ceramic plate may include an adhesive portion without the antistatic coating layer on an external surface, and the pad may be adhered to the first ceramic plate in the adhesive portion.

According to an example embodiment of the present disclosure, a robotic arm includes an arm body having an intake flow path formed therein; and a plurality of pads connected to the arm body and including through-holes communicating with the intake flow path, wherein the arm body includes first and second ceramic plates, and an antistatic coating layer disposed on an external side of the first ceramic plate, wherein the pad includes the first layer in contact with a substrate and having conductivity, a second layer disposed below the first layer, formed of a material having elasticity higher than that of the first layer and having conductivity, and a third layer disposed below the second layer and formed of a metal material having rigidity higher than that of the second layer, wherein the first ceramic plate includes a connection groove connected to the pad, and wherein a conductive portion connecting at least the third layer of the pad to the antistatic coating layer on an external side of the pad is provided.

According to an example embodiment of the present disclosure, an apparatus for treating a substrate includes a substrate accommodation unit for accommodating the substrate; a substrate processing unit for processing the substrate; and a transfer robot for transferring the substrate between the substrate accommodation unit and the substrate processing unit, wherein the transfer robot includes the robotic arm and a robot body connected to the robotic arm and moving the robotic arm, and wherein a ground path connected from the pad of the robotic arm to the robot body is formed.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Figure 1:
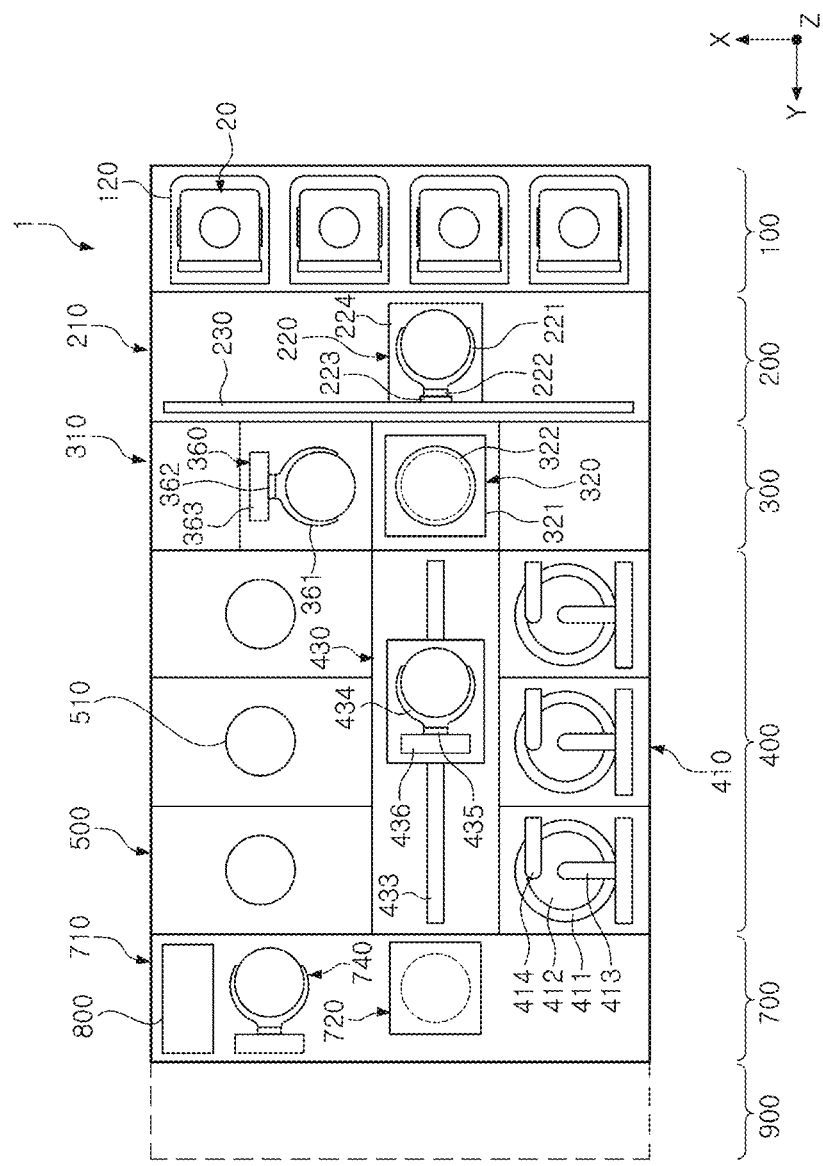
FIG. 1 is a diagram illustrating an apparatus for treating a substrate according to an example embodiment of the present disclosure.

Hereinafter, embodiments of the present disclosure will be described as below with reference to the accompanying drawings. In describing the example embodiments of the present disclosure, when it is determined that the detailed description of a known technique related to the present disclosure may unnecessarily obscure the gist of the present disclosure, the detailed description thereof will not be provided. Also, the same reference numerals are used for components having similar functions and functions in the drawings. Also, terms such as "upper," "upper portion," "upper surface," "lower," "lower portion," "lower surface," "side surface," and the like are based on the drawings, and the terms may vary depending on the direction in which the elements or components are disposed.

In the example embodiments, the term "connected" may not only refer to "directly connected" but also include "indirectly connected" by may refer to of an adhesive layer, or the like. Also, the term "electrically connected" may include both of the case in which elements are "physically connected" and the case in which elements are "not physically connected." The terms, "include," "comprise," "is configured to," etc. of the description are used to indicate the presence of features, numbers, operations, operations, elements, parts or combination thereof, and do not exclude the possibilities of combination or addition of one or more features, numbers, steps, operations, elements, parts or combination thereof.

FIG. 1 is a diagram illustrating an apparatus 1 for treating a substrate to which a transfer robot including a robotic arm is applied.

The apparatus 1 for treating a substrate may include a load port 100, an index module 200, a buffer module 300, an application and development module 400, and a purge module 800. The load port 100, the index module 200, the buffer module 300, the application and development module 400, and the interface module 700 may be disposed in order linearly in one direction. The purge module 800 may be provided in the interface module 700. Alternatively, the purge module 800 may be provided at various positions, such as a position on the rear end of the interface module 700 to which an exposure apparatus is connected, or a side portion of the interface module 700.

Hereinafter, the direction in which the load port 100, the index module 200, the buffer module 300, the application and development module 400, and the interface module 700 are disposed may be referred to as a first direction Y, a direction perpendicular to the first direction Y when viewed from above may be referred to as a second direction X, and a direction perpendicular to the first direction Y and the second direction X may be referred to as a third direction Z.

The substrate W may move while being accommodated in the cassette 20. The cassette 20 may have a structure sealed from the outside. For example, as the cassette 20, a front open unified pod (FOUP) having a door on the front side may be used.

The load port 100 may have a mounting table 120 on which the cassette 20 in which the substrate W is accommodated is disposed. A plurality of mounting tables 120 may be provided, and the mounting tables 120 may be disposed linearly in the second direction X.

The index module 200 may transfer the substrate W between the cassette 20 and the buffer module 300 disposed on the mounting table 120 of the load port 100. The index module 200 may include a frame 210, an index robot 220, and a guide rail 230. The frame 210 may be provided in the shape of a rectangular parallelepiped with an empty interior, and may be disposed between the load port 100 and the buffer module 300. The frame 210 of the index module 200 may be provided on a level lower than a level of the frame 310 of the buffer module 300. The index robot 220 and the guide rail 230 may be disposed in the frame 210. The index robot 220 may include a hand 221 for directly handling the substrate W and configured to move in the first direction Y, the second direction X, and the third direction Z. The index robot 220 may include a hand 221, an arm 222, a support 223, and a pedestal 224. The hand 221 may be fixed to and installed on the arm 222. The arm 222 may be configured to be expand and reduced and rotatable. The support 223 may be disposed such that a length direction thereof may be disposed in the third direction Z. The arm 222 may be coupled to the support 223 to be movable along the support 223. The support 223 may be fixed and coupled to the support 224. The guide rail 230 may be provided such that a length direction thereof may be disposed in the second direction X. The pedestal 224 may be coupled to the guide rail 230 so as to be linearly movable along the guide rail 230.

The buffer module 300 may include a frame 310, a buffer 320 and a buffer robot 360. The frame 310 may be provided in the shape of a rectangular parallelepiped with an empty interior, and may be disposed between the index module 200 and the application and development module 400. The buffer 320 and the buffer robot 360 may be disposed within the frame 310. The buffer robot 360 may be disposed to be spaced apart from the buffer 320 by a predetermined distance in the second direction X.

The buffer 320 may temporarily store a plurality of substrates W. The housing 321 of the buffer 320 may have an opening in the direction in which the buffer robot 360 is provided and the direction in which the application portion robot 432 disposed in the application module is provided.

The buffer robot 360 may transfer the substrate W to the buffer 320. The buffer robot 360 may include a hand 361, an arm 362, and a support 363. The hand 361 may be fixed to and installed on the arm 362. The arm 362 may be configured to be expand and reduced, such that the hand 361 may move in the second direction X. The arm 362 may be coupled to the support 363 so as to be linearly movable in the third direction Z along the support 363. The buffer robot 360 may be provided such that the hand 361 may be driven only by two axes in the second direction X and the third direction Z.

The application module may include a process of applying a photoresist such as a photoresist to the substrate W and a heat treatment process such as heating and cooling the substrate W before and after the resist application process. The application module may have an application chamber 410, a bake chamber unit 500, and a transfer chamber 430. The application chamber 410, the transfer chamber 430, and the chamber unit 500 may be disposed in order in the second direction X. That is, the application chamber 410 may be provided on one side of the transfer chamber 430, and the bake chamber unit 500 may be provided on the other side of the transfer chamber 430 with reference to the transfer chamber 430.

A plurality of the application chambers 410 may be provided, and a plurality of application chambers 410 may be provided in each of the first direction Y and the third direction Z. The bake chamber unit 500 may include a plurality of bake chambers 510, and a plurality of the plurality of bake chambers 510 may be provided in each of the first direction Y and the third direction Z. The transfer chamber 430 may be disposed in parallel with the first buffer 320 of the first buffer module 300 in the first direction Y. An application portion robot 432 and a guide rail 433 may be disposed in the transfer chamber 430. The transfer chamber 430 may have a rectangular shape. The application unit robot 432 may transfer the substrate W between the bake chamber 510, the application chamber 410, and the buffer 320 of the buffer module 300.

The guide rail 433 may be disposed such that a length direction thereof may be parallel to the first direction Y. The guide rail 433 may guide an application portion robot 432 to move linearly in the first direction Y. The application portion robot 432 may have a hand 434, an arm 435, and a support 436. The hand 434 may be fixed to and installed on the arm 435. The arm 435 may be configured to be expand and reduced such that the hand 434 may move in the horizontal direction. The support 436 may be provided such that a length direction thereof may be disposed in the third direction Z. The arm 435 may be coupled to the support 436 so as to be linearly movable in the third direction Z along the support 436.

The application chambers 410 may have the same structure, but the types of chemical solutions used in each application chamber 410 may be different from each other. As the chemical solution, a chemical solution for forming a photoresist film or an anti-reflection film may be used.

The application chamber 410 may apply a chemical solution to the substrate W. The application chamber 410 may have a cup 411, a substrate support 412, and a nozzle 413. The cup 411 may have a shape of which an upper portion is open. The substrate support 412 may be disposed in the cup 411 and may support the substrate W. The substrate support 412 may be provided to rotate. The nozzle 413 may supply the chemical solution to the substrate W disposed on the substrate support 412. The chemical solution may be applied to the substrate W by a spin coating method. Also, a nozzle 414 for supplying a cleaning solution such as deionized water (DIW) to clean the surface of the substrate W on which the chemical solution is applied, and a back rinse nozzle for cleaning the lower surface of the substrate W (not illustrated) may be further provided in the application chamber 410.

The interface module 700 may connect the application and development module 400 to an external exposure apparatus 900. The interface module 700 may include an interface frame 710, an interface buffer 720, and a transfer robot 740, and the transfer robot 740 may transfer the substrate which has been transferred to the interface buffer 720 as the application and development module 400 is terminated to the exposure apparatus 900.

The apparatus 1 for treating the substrate may include a substrate accommodation unit in which a substrate is accommodated, such as a mounting table 120 or a buffer 320, a substrate processing unit for treating a substrate, such as a coating chamber 410 for applying a coating liquid, or a bake chamber 510 for performing a heat treatment, a transfer robot moving a substrate, such as an index robot 220, a buffer robot 360, an application portion robot 432, and a transfer robot 740, and the example embodiment may be applied to a robotic arm mounted on a transfer robot used in the apparatus 1 for treating a substrate. In the case in FIG. 1, a photo apparatus in the apparatus 1 for treating a substrate, but the example embodiment is not applicable only to the photo apparatus, and may be applied to other apparatuses, such as, for example, an etcher or a clean apparatus.

Figure 2:
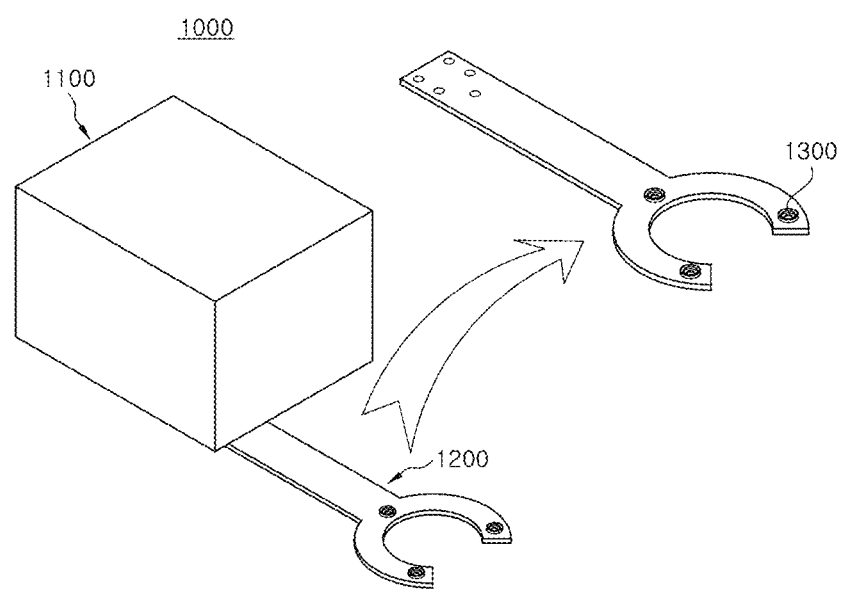
FIG. 2 is a diagram illustrating a transfer robot including a robotic arm.
Figure 3:
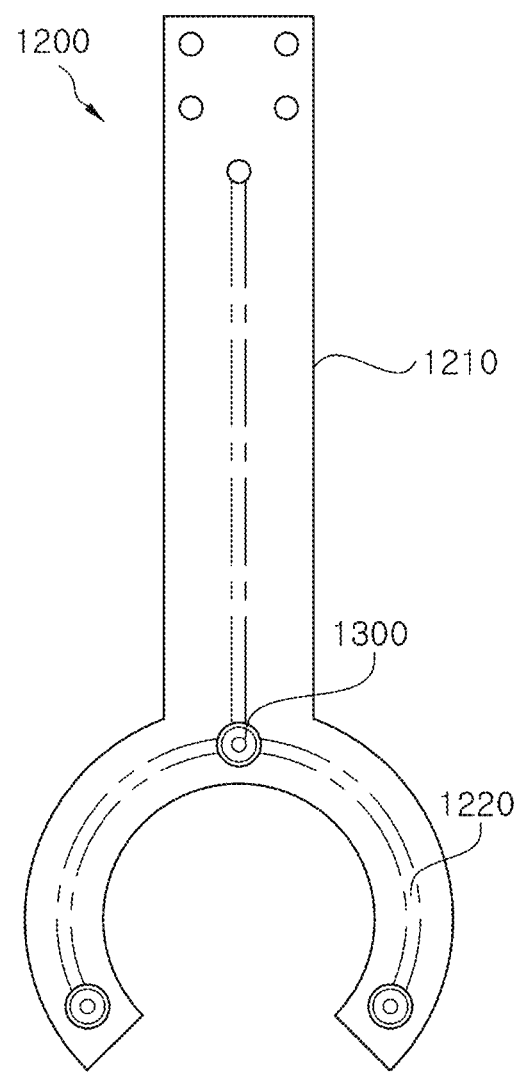
FIG. 3 is a diagram illustrating the robotic arm in FIG. 2.
Figure 4:
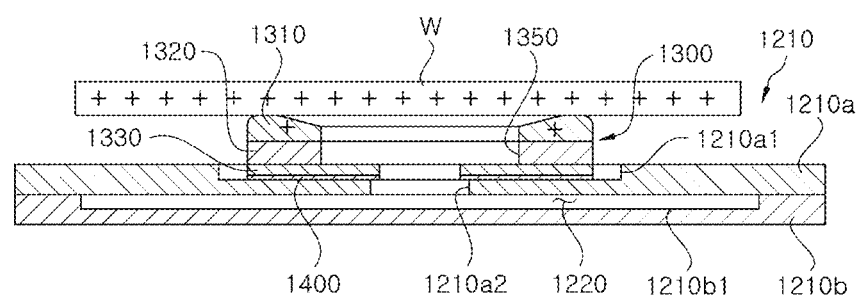
FIG. 4 is a cross-sectional diagram illustrating a portion of the robotic arm in FIG. 3.

FIGS. 2 to 4 are diagrams illustrating a robotic arm including a ceramic material and a transfer robot including the robotic arm. Specifically, FIG. 2 is a diagram illustrating a transfer robot including a robotic arm, FIG. 3 is a diagram illustrating the robotic arm in FIG. 2, and FIG. 4 is a cross-sectional diagram illustrating a portion of the robotic arm in FIG. 3.

The transfer robot 1000 in FIG. 2 may include a robot body 1100 and a robotic arm 1200 connected to the robot body 1100. The robotic arm 1200 may be a portion moved by the robot body 1100, and may refer to an end effector and may include a hand. The robot body 1100 may include components for moving the robotic arm 1200 such as a driving unit and a guide, and may be connected to the apparatus 1 for treating a substrate as described with reference to FIG. 1.

In the example embodiment, the robotic arm 1200 may include a blade or an arm body 1210, and the arm body 1210 may include a plurality of pads 1300 in contact with the substrate. An intake flow path 1220 may be formed in the arm body 1210. The arm body 1210 may include first and second ceramic plates 1210a and 1210b in order to secure flatness and to prevent vibration while preventing deformation such as bending due to the weight of the substrate. In the example embodiment, ceramic included in the ceramic plates 1210a and 1210b may be generally used ceramic, such as, for example, quartz or alumina ($Al_2O_3$).

The intake flow path 1220 may be formed between the first and second ceramic plates 1210a and 1210b, and the first and second ceramic plates 1210a and 1210b may be adhered by an adhesive. A through-hole 1210a2 may be formed in the first ceramic plate 1210a, and a flow path groove 1210b1 may be formed in the second ceramic plate 1210b such that the flow path 1220 may be connected to the pad 1300.

The first ceramic plate 1210a may include a connection groove 1210a1 disposed on the opposite side of the surface oriented to the second ceramic plate 1210b, and the pad 1300 may be adhered to the connection groove 1210a1. The pad 1300 may be formed as a single layer, but as illustrated in FIG. 4, the pad 1300 may be formed in a plurality of layers.

When the pad 1300 is formed in a plurality of layers, a through-hole 1350 may be formed in the plurality of layers, such that the intake flow path 1220 and the through-hole 1350 may be connected to each other and suction force may be provided to the substrate. The pad 1300 may include the first layer 1310 in contact with the substrate, the third layer 1330 adhered to the first ceramic plate 1210a, and the second layer 1320 disposed between the first and third layers 1310 and 1330.

The third layer 1330 may be formed of a metal having rigidity to stably maintain contact with the first ceramic plate 1210a and to withstand shear force, such as, for example, stainless steel (STS) or aluminum, the second layer 1320 may be formed of a silicone material having elasticity higher than that of the first layer 1310 or the third layer 1330 such that the warpage substrate W may also be adsorbed, and the first layer 1310 may be formed of a resin material in direct contact with the substrate and having durability, such as, for example, polyether ether ketone (PEEK), and may be formed of conductive PEEK carbon or PEEK electro-static discharge (ESD).

The pad 1300 may be adhered to the first ceramic plate 1210a through an adhesive 1400. That is, an adhesive may be disposed between the pad 1300 and the first ceramic plate 1210a. The adhesive is not limited to any particular example, and an epoxy-based adhesive may be used.

The pad 1300 may be a fusion-bonded pad in which the layers thereof may be bonded by melting and pressing the first and second layers 1310 and 1320, without bonding the layers using an adhesive, but an example embodiment thereof is not limited thereto.

As the first layer 1310, a conductive resin material may be used, and the second layer 1320 may be formed of a silicone material. Even when a conductive resin material is used in the first layer 1310, since an electric flow is blocked by the silicon material of the second layer 1320, antistatic may not occur even when the substrate W is in contact with the first layer 1310, and electric charges may be accumulated on the substrate W and the first layer 1310.

Also, even when the pad 1300 includes only the first layer 1310, the arm body 1210 of the robotic arm 1200 may include the non-conductive ceramic plates 1210a and 1210b, such that the electric charges of first layer 1310 may be blocked with the ceramic plates 1210a and 1210b and may be inevitably accumulated. Accordingly, the substrate may also be transferred to the subsequent process in a charged state as electric charges may not escape the substrate, which may cause issues in subsequent processes.

Figure 5:
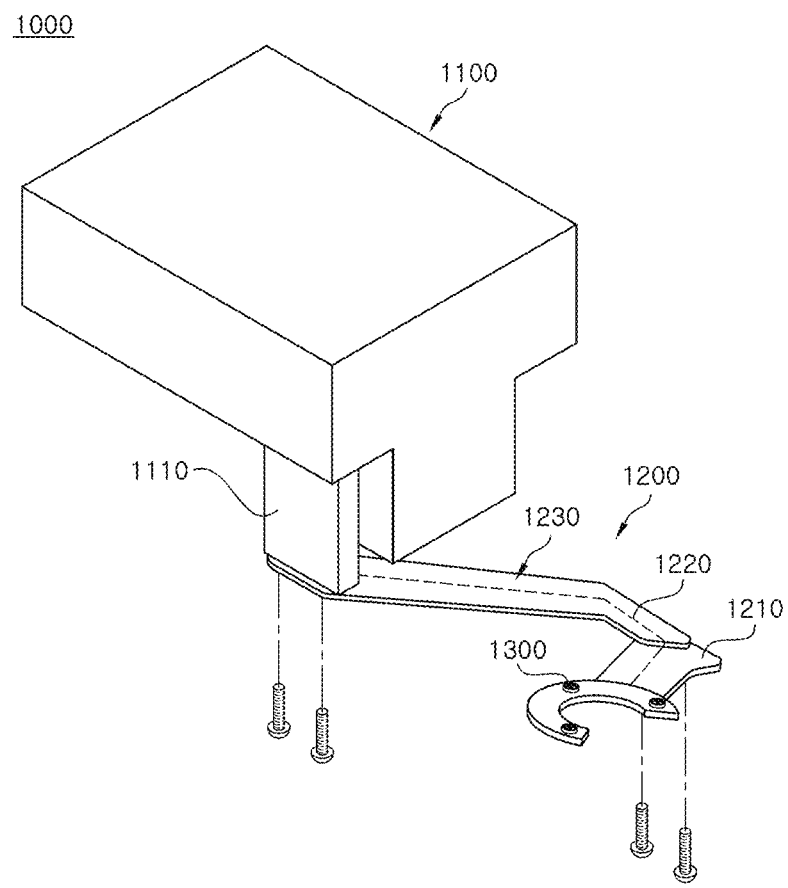
FIG. 5 is a diagram illustrating a transfer robot including a robotic arm according to an example embodiment of the present disclosure.
Figure 6:
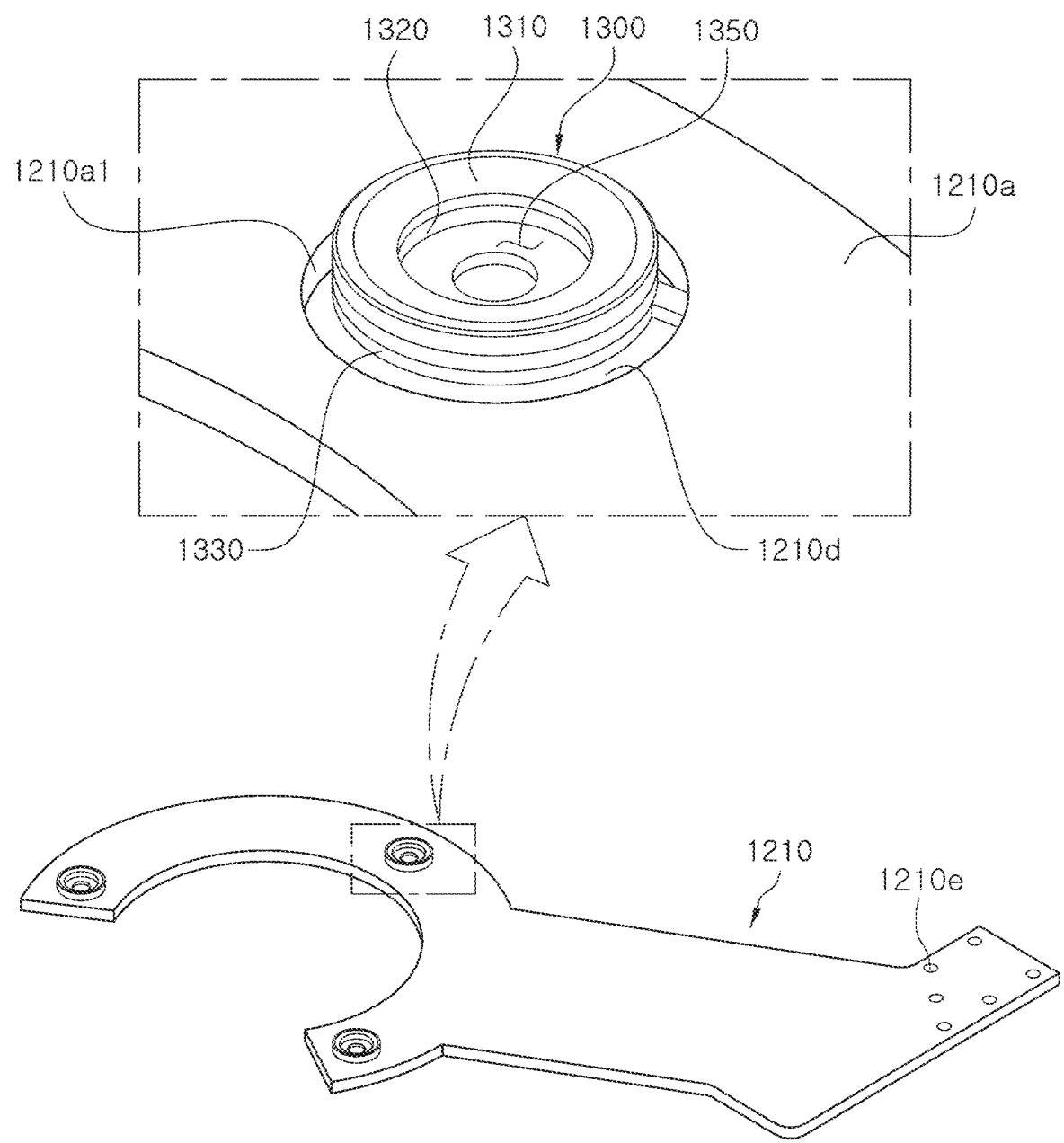
FIG. 6 is an enlarged diagram illustrating a portion of the robotic arm in FIG. 5.
Figure 7:
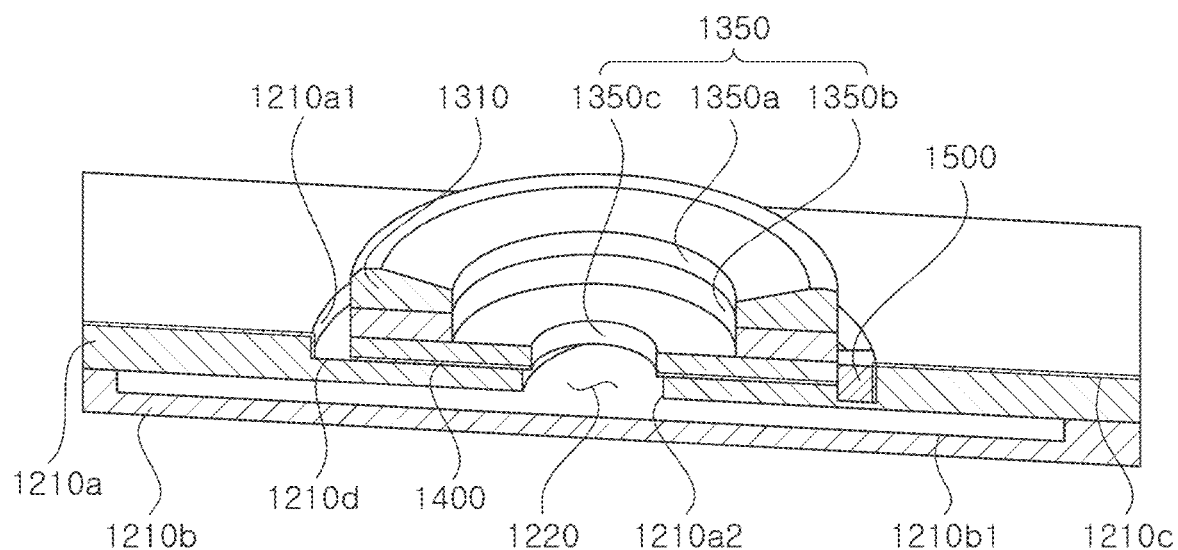
FIG. 7 is a perspective cross-sectional diagram illustrating the robotic arm in FIG. 5.
Figure 8:
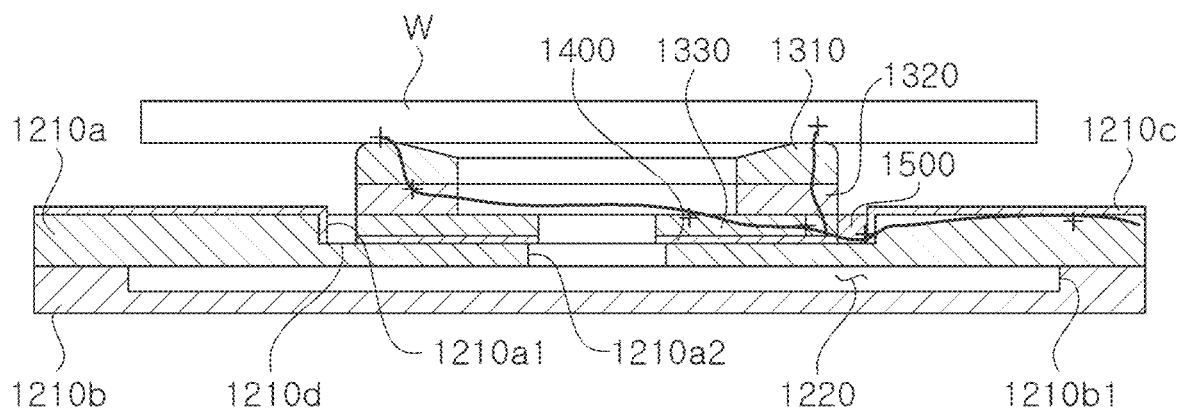
FIG. 8 is a cross-sectional diagram illustrating the robotic arm in FIG. 5.

FIGS. 5 to 8 illustrate a robotic arm 1200 and a transfer robot 1000 including the same according to an example embodiment. Specifically, FIG. 5 is a diagram illustrating a transfer robot 1000 including a robotic arm 1200 according to an example embodiment, FIG. 6 is an enlarged diagram illustrating a portion of the robotic arm 1200 in FIG. 5, FIG. 7 is a perspective cross-sectional diagram illustrating a portion of the robotic arm 1200 in FIG. 5, and FIG. 8 is a cross-sectional diagram illustrating the robotic arm 1200 in FIG. 5.

As illustrated in FIGS. 5 to 8, the transfer robot 1000 according to an example embodiment may include a robot body 1100 for moving the robotic arm 1200, a robotic arm connected to the robot body 1100 1200 and a plurality of pads 1300 bonded to the robotic arm 1200, and the robotic arm 1200 may include an arm body 1210 and an arm base 1230 coupled to the arm body 1210. The arm body 1210 and the arm base 1230 include an intake flow path 1220, and the intake flow path 1220 may be connected to the pad 1300 and may allow a substrate to be suctioned to the pad 1300.

The arm body 1210 may include ceramic plates 1210a and 1210b, and the arm base 1230 connected to the arm body 1210 may be formed of a metal material having good rigidity. In the example embodiment, the arm body 1210 and the arm base 1230 may be configured separately, or may be formed as an integrated single member.

The arm base 1230 may be connected to the moving unit 1110 of the robot body 1100, and the robotic arm 1200 may move according to the movement of the moving unit 1110.

The arm body 1210 may include a plurality of ceramic plates 1210a and 1210b, and may include first and second ceramic plates 1210a and 1210b similar to FIGS. 2 to 4 in the example embodiment. The first ceramic plate 1210a may include a connection groove 1210a1 through which the pad 1300 is adhered, and the pad 1300 may be adhered to the connection groove 1210a1. The second ceramic plate 1210b may include a flow path groove 1210b1 to form the intake flow path 1220 together with the first ceramic plate 1210a. The lower surface of the first ceramic plate 1210a may block the open surface of the channel groove 1210b1 such that the intake flow path 1220 may be formed.

The intake flow path 1220 may be formed between the first and second ceramic plates 1210a and 1210b, and the first and second ceramic plates 1210a and 1210b may be adhered to each other by an adhesive.

In the example embodiment, the arm body 1210 may include an antistatic coating layer 1210c on the external surface of the first ceramic plate 1210a, that is, on the outside, in order to form a path through which electric charges may move. The antistatic coating layer 1210c may be formed on the external surface of the first ceramic plate 1210a, or may be further formed on the external surface of the second ceramic plate 1210b.

The antistatic coating layer 1210c may be applied to the first ceramic plate 1210a, and may be a coating layer including fluororesin and a conductive additive, and may have an electrical resistance between $10^5$ to $10^9 \Omega$, such as, for example, antistatic Teflon coating. However, when forming the antistatic coating layer 1210c, it may be difficult to adhere an additional component such as the pad 1300 due to the antistatic coating layer 1210c, or even when the component is adhered, durability may be lowered, such that at least a portion of the connection groove 1210a1 may be masked before the antistatic coating such that the antistatic coating layer 1210c may not be formed. The pad 1300 and the conductive portion 1500 may be directly attached to the first ceramic plate 1210a without passing through the antistatic coating layer 1210c.

In this case, in the first ceramic plate 1210a, the antistatic coating layer 1210c is not formed and another component, that is, for example, a portion in which the pad 1300 and the conductive portion 1500 may be adhered may be referred to as an adhesive portion 1210d. The adhesive portion 1210d may be a portion determining an area in which the pad 1300 and the conductive portion 1500 and the first ceramic plate 1210a are bonded to each other, and may be configured to have a size larger than the region corresponding to the pad 1300 and the conductive portion 1500, and for example, the adhesive portion 1210d may be the entire bottom surface of the connection groove 1210a1, but only the region corresponding to the pad 1300 and the conductive portion 1500 may be formed as the adhesive portion 1210d.

The pad 1300 may include a plurality of layers 1310, 1320, and 1330, and a through-hole 1350 may be formed in each of the plurality of layers 1310, 1320, and 1330 such that the intake flow path 1220 may be connected to the through-hole 1350 and suction force may be provided to the substrate W. The pad 1300 may include a first layer 1310 in contact with the substrate W, a third layer 1330 adhered to the first ceramic plate 1210a, and a second layer 1320 disposed between the first and third layers 1310 and 1330.

The third layer 1330 may be formed of a metal, such as, for example, Stainless steel (STS) or aluminum, which may stably maintain contact with the first ceramic plate 1210a and may withstand shear force, and the second layer 1320 may be formed of a silicon material having elasticity higher than that of the first layer 1310 or the third layer 1330 such that the warpage wafer may also be suctioned thereto. The first layer 1310 may be formed of a resin material which may have durability and conductivity while in direct contact with the substrate, and may be fused through a thermoplastic, such as, for example, PEEK carbon or PEEK ESD. Here, the second layer 1320 may be formed of a conductive silicon material so as not to insulate the first layer 1310 and the third layer 1330 from each other.

The through-holes 1350a, 1350b, and 1350c of the first to third layers 1310, 1320, and 1330 may communicate with the intake flow path 1220, and the inner diameter of the through-hole 1350c of the third layer 1330 may be smaller than the inner diameter of the through-holes 1350a and 1350b of the other layers, the first and second layers 1310 and 1320.

Also, in the case of the first layer 1310, the level of the portion neighboring to the through-hole 1350a may be lower than that of the far portion, such that the inner side may have a low slope, and accordingly, the first layer 1310 may be in contact with the substrate in a position far from the through-hole 1350a.

The pad 1300 may be adhered to the first ceramic plate 1210a through an adhesive 1400. That is, the adhesive 1400 may be disposed between the pad 1300 and the first ceramic plate 1210a. The adhesive is not limited to any particular example, and an epoxy-based adhesive may be used.

The third layer 1330 may be adhered to the first ceramic plate 1210a through the adhesive 1400. In order to secure adhesive performance and durability, the area of the adhesive portion 1210d may be greater than the lower surface of the third layer 1330, and accordingly, even when a conductive path is formed from the first layer 1310 to the third layer 1330, the conductive path may not be formed to the antistatic coating layer 1210c and may be inevitably broken.

In the example embodiment, a conductive portion 1500 may be provided to connect the pad 1300 to the antistatic coating layer 1210c. The conductive portion 1500 may be a conductive layer connected to the pad 1300 and the antistatic coating layer 1210c, and may be formed by curing silver paste. The conductive portion 1500 may connect the pad 1300 to the antistatic coating layer 1210c on the external side of the pad 13

Similarly to the pad 1300, in order to secure adhesive durability, the conductive portion 1500 may be adhered to the first ceramic plate 1210a in the adhesive portion 1210d, that is, in a portion in which the antistatic coating layer 1210c is not formed. When the conductive portion 1500 is formed of a conductive paste, the conductive paste may be directly attached to the first ceramic plate 1210a without a separate adhesive.

The arm body 1210 may be connected to the arm base 1230, and the arm body 1210 may have a plurality of fastening holes 1210e penetrating through the arm body 1210 on an end opposite to the pad 1300, and the arm base 1230 also may have a fastening hole, such that the arm body 1210 and the arm base 1230 may be fastened by bolting between the fastening hole 1210e of the arm body 1210 and the fastening hole of the arm base 1230. In this bolting connection, since the two members are connected through a bolt, the members may be electrically connected to each other even when an insulating layer such as surface coating or anodizing is formed.

As illustrated in FIGS. 5 to 8, in an example embodiment, a charge moving path may be formed from the first layer 1310 in contact with the substrate in the robotic arm 1200 to the antistatic coating layer 1210c through the second layer 1320 of conductive silicon material, the third layer 1330 formed of a metal material and the conductive portion 1500, and electric charges may move along the surface of the first ceramic plate 1210a through the antistatic coating layer 1210c. Since the arm body 1210 and the arm base 1230 are coupled with a metal bolt, the electric charge transferred to the antistatic coating layer 1210c may flow to the arm base 1230 through the bolt. Thereafter, the electric charge may move to the robot body 1100 through the arm base 1230 formed of a metal material.

In the example embodiment, a ground path from the pad 1300 in contact with the substrate W to the robot body 1100 may be formed, and accordingly, the electric charge of the substrate may escape externally without being accumulated, such that the issues in subsequent processes due to the charging of the substrate may be prevented.

Also, in the example embodiment, a ceramic material which may be difficult to process into a complex shape may be used, but the shear force of an adhesive such as the pad 1300, adhesion durability, and even a ground path may be secured, and flatness and vibration of the ceramic plate may be reduced.

Further, a grounding path may be secured without a wire, such that grounding may be performed without interfering with the operation of the robot due to the wire.

Figure 9:
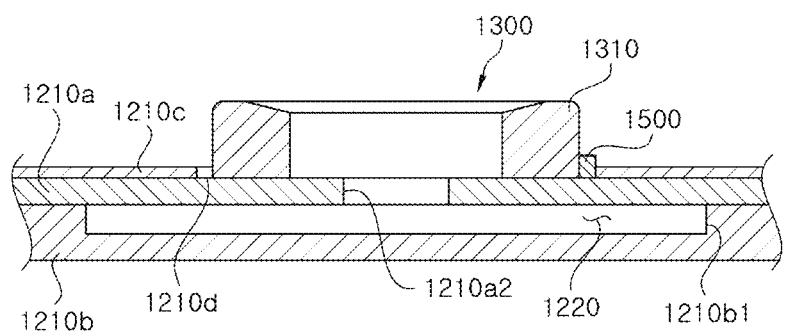
FIG. 9 is a cross-sectional diagram illustrating a portion of a robotic arm according to another example embodiment of the present disclosure.

FIG. 9 is a cross-sectional diagram illustrating a portion of a robotic arm 1200 according to another example embodiment.

The example embodiment in FIG. 9 may be the same as the example embodiment in FIGS. 5 to 8 other than the pad 1300 and the first ceramic plate 1210a in the robotic arm 1200, and thus, different components will be described and the descriptions of the other components will not be provided.

As illustrated in FIG. 9, in the example embodiment, the first ceramic plate 1210a may not include the connection groove 1210a1, and the adhesive portion 1210d may be configured to be larger than the lower surface of the pad 1300.

The pad 1300 may only include the first layer 1310, not a plurality of layers, and the lower surface of the first layer 1310 may be adhered to the upper surface of the first ceramic plate 1210a with the adhesive 1400.

The conductive portion 1500 may be adhered to the first ceramic plate 1210a in the adhesive portion 1210d, and may electrically connect the external surface of the pad 1300 to the antistatic coating layer 1210c formed on the first ceramic plate 1210a.

In the example embodiment, in a state in which the pad 1300 is configured as a single layer, a ground path may be implemented without the connection groove 1210a1, and accordingly, the same effect as in the example embodiment in FIGS. 5 to 8 may be obtained.

Figure 10:
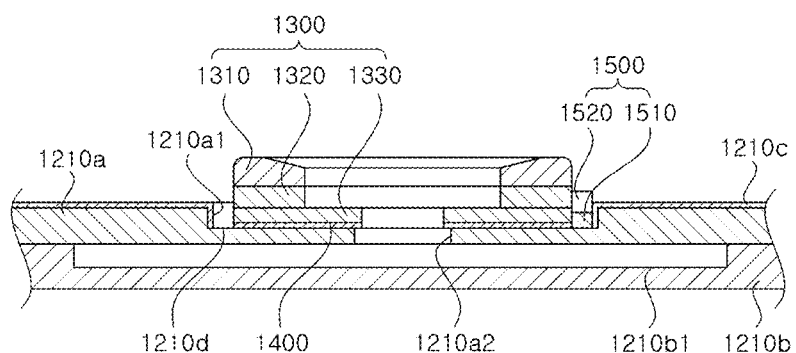
FIG. 10 is a cross-sectional diagram illustrating a portion of a robotic arm according to another example embodiment of the present disclosure.

FIG. 10 is a cross-sectional diagram illustrating a portion of a robotic arm 1200 according to another example embodiment.

The example embodiment in FIG. 10 may be the same as the example embodiment in FIGS. 5 to 8 other than the conductive portion 1500, and thus, the description of other components will not be provided and only the conductive portion 1500 will be described.

In the example embodiment in FIG. 10, the conductive portion 1500 may further include an additional adhesive layer 1520 on the conductive paste layer 1510 formed by a conductive paste connecting the external surface of the pad 1300 to the antistatic coating layer 1210c in the connection groove 1210a1.

The additional adhesive layer 1520 may cover the entire external surface of the conductive paste layer 1510. The additional adhesive layer 1520 may be an epoxy-based adhesive.

The additional adhesive layer 1520 may cover the conductive paste layer 1510 and may reinforce durability of the conductive paste layer 1510, and accordingly, durability of the overall robotic arm 1200 may also be increased.

Figure 11:
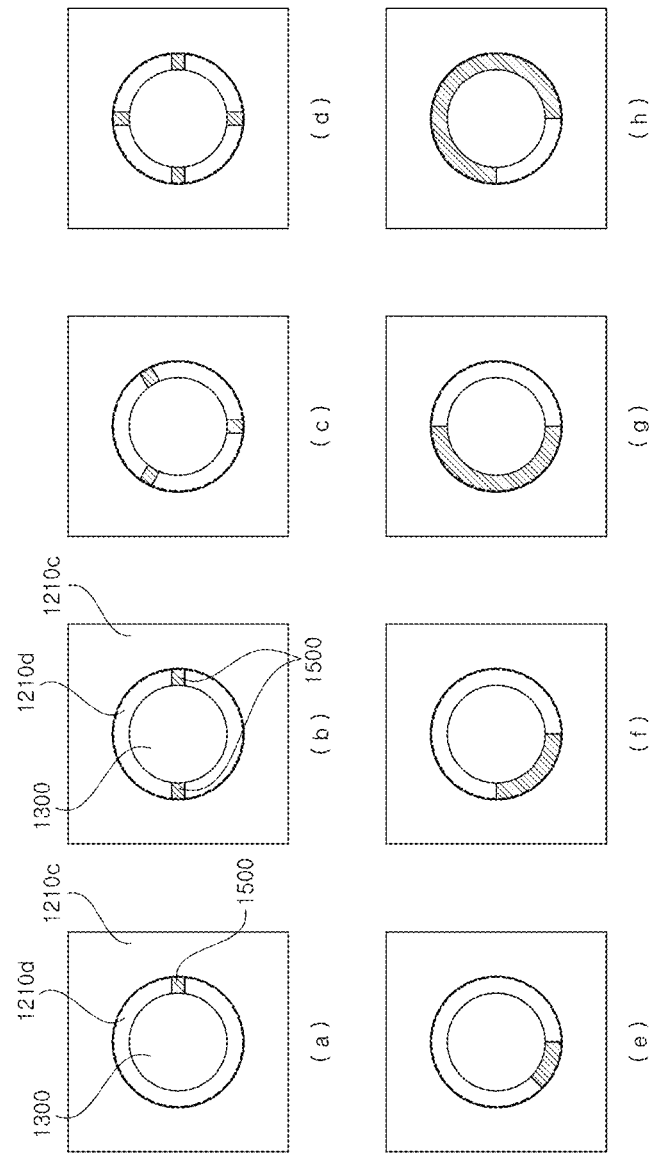
FIG. 11 is a plan diagram illustrating a portion of a robotic arm according to another example embodiment of the present disclosure.

FIG. 11 is a plan diagram illustrating a portion of the robotic arm 1200 according to another example embodiment.

Figure 12:
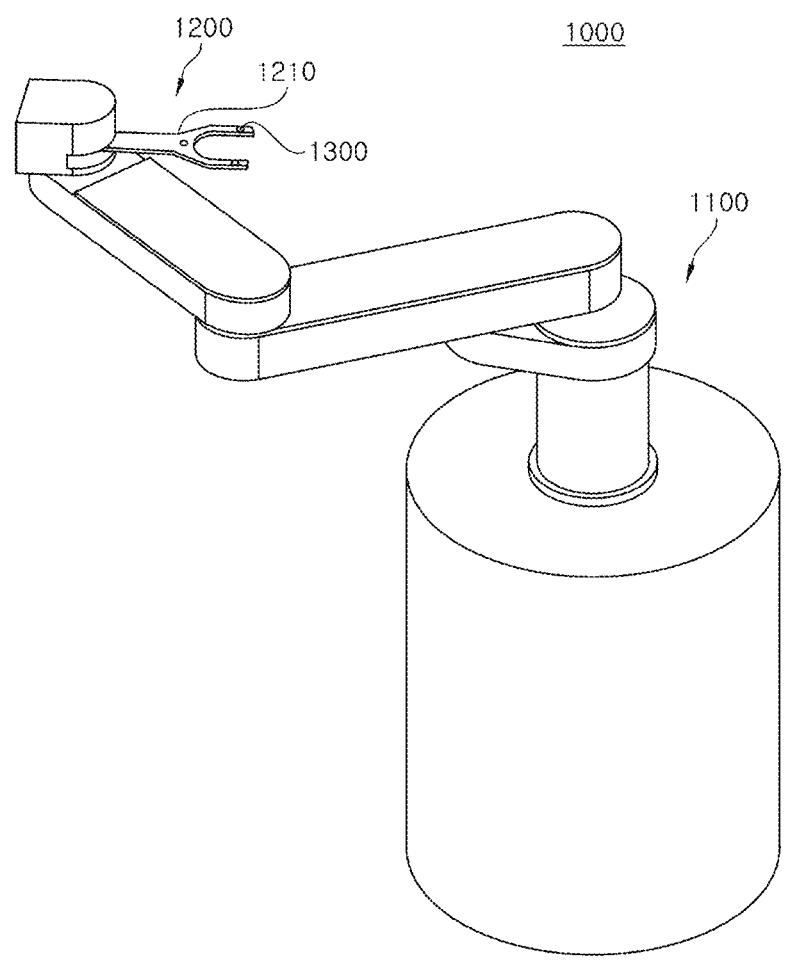
FIG. 12 is a diagram illustrating a transfer robot including a robotic arm according to another example embodiment of the present disclosure.

FIG. 11 illustrates modified examples of the conductive portion 1500. In the conductive portion 1500, only one pad 1300 may not be formed, and a plurality of pads may be formed as in FIGS. 12 (b), (c) and (d). Also, the side surface of the pad 1300 connected by the conductive portion 1500 may be a predetermined distance as illustrated in FIG. 12(a), or the pad may be covered at a predetermined angle from the center of the pad 1300. For example, in FIGS. 12(e) to (h), the pad 1300 may be surrounded by ⅛, ¼, ½, or ¼.

FIG. 12 illustrates a transfer robot 1000 according to another example embodiment. As in FIG. 12, a multi-joint robotic arm 1200 may be connected to the robot body 1100, and a plurality of robotic arms 1200 may include a distal arm body 1210, and a plurality of pads 1300 may be connected to the arm body 1210. The shape of the arm body 1210 in FIG. 12 may be different from the example in FIGS. 5 to 8, but the same structure may be applied thereto.

In FIG. 12, a single arm body 1210 may be applied to a single robotic arm 1200, but in the example embodiment, a plurality of arm bodies 1210 may be applied to a single robotic arm 1200. In this case, a plurality of arm bodies 1210 may be connected to each other through the arm base 1230, or the plurality of arm bodies 1210 may be connected to the robot body 1100, and a ground path may be formed in each arm body 1210 such that the substrate W suctioned to each arm body 1210 may be grounded.

According to the aforementioned example embodiments, a robotic arm which may destaticize the transferred substrate by forming an antistatic path in the robotic arm including a ceramic material, and an apparatus for treating a substrate including the same may be provided.

While the example embodiments have been illustrated and described above, it will be configured as apparent to those skilled in the art that modifications and variations could be made without departing from the scope of the present disclosure as defined by the appended claims.

What is claimed is:

1. A robotic arm, comprising:
an arm body; and
a plurality of pads connected to the arm body and in contact with a substrate,
wherein the arm body includes a ceramic plate and an antistatic coating layer disposed on an external surface of the ceramic plate,
wherein the pad includes a first conductive layer, and
wherein a conductive portion connecting the pad to the antistatic coating layer on an external side of the pad is provided,
wherein the ceramic plate includes first and second ceramic plates, and an intake flow path is formed between the first and second ceramic plates,
wherein the pad includes a through-hole communicating with the intake flow path,
wherein the pad is connected to the first ceramic plate, and
wherein the first ceramic plate includes an adhesive portion without the antistatic coating layer on an external surface, and the pad is adhered to the first ceramic plate in the adhesive portion.

2. The robotic arm of claim 1,
wherein the first ceramic plate includes a connection groove connected to the pad,
wherein at least a portion of the adhesive portion is disposed in the connection groove, and
wherein at least a portion of the conductive portion is adhered to the first ceramic plate on the adhesive portion in the connection groove.

3. The robotic arm of claim 1, wherein the pad is connected to the adhesive portion of the first ceramic plate through an adhesive layer.

4. The robotic arm of claim 2, wherein the conductive portion includes a conductive adhesive connecting the pad to the antistatic coating layer.

5. The robotic arm of claim 4,
wherein the conductive adhesive is a silver paste, and
wherein the conductive portion further includes an additional adhesive layer configured to protect the conductive adhesive.

6. The robotic arm of claim 1, further comprising:
an arm base connecting the arm body to a robot body,
wherein a plurality of arm bodies are connected to the arm base, and
wherein at least one of the plurality of arm bodies includes a plurality of fastening holes for connection to the arm base on an end side of the at least one of the plurality of arm bodies opposite to the pad.

7. The robotic arm of claim 1,
wherein the first and second ceramic plates include alumina, and
wherein the second ceramic plate includes a flow path groove forming the intake flow path on a surface oriented to the first ceramic plate.

8. The robotic arm of claim 1, wherein the conductive portion is provided in a plurality of positions surrounding the pad.

9. An apparatus for treating a substrate, the apparatus comprising:
a substrate accommodation unit for accommodating the substrate;
a substrate processing unit for processing the substrate; and
a transfer robot for transferring the substrate between the substrate accommodation unit and the substrate processing unit,
wherein the transfer robot includes the robotic arm of claim 1 and a robot body connected to the robotic arm and moving the robotic arm, and
wherein a ground path connected from the pad of the robotic arm to the robot body is formed.

10. A robotic arm, comprising:
an arm body; and
a plurality of pads connected to the arm body and in contact with a substrate,
wherein the arm body includes a ceramic plate and an antistatic coating layer disposed on an external surface of the ceramic plate,
wherein the pad includes a first conductive layer,
wherein a conductive portion connecting the pad to the antistatic coating layer on an external side of the pad is provided, and
wherein the pad includes:
the first layer in contact with a substrate;
a second layer disposed below the first layer and formed of a material having elasticity higher than that of the first layer, and a third layer disposed below the second layer and formed of a material having rigidity higher than that of the second layer.

11. The robotic arm of claim 10,
wherein the second layer includes conductive silicon,
wherein the third layer is a metal layer, and
wherein the antistatic coating layer includes fluororesin.

12. The robotic arm of claim 10, wherein the conductive portion connects the third layer to the antistatic coating layer.

13. The robotic arm of claim 10,
wherein the ceramic plate and the first to third layers include a through-hole connected to the intake flow path, and
wherein a cross-sectional area of the through-hole of the third layer among the through-holes of the first to third layers is the smallest.

14. The robotic arm of claim 10, wherein the pad is a fusion-type pad in which the first to third layers are bonded to each other by fusion.

15. A robotic arm, comprising:
an arm body having an intake flow path formed therein; and
a plurality of pads connected to the arm body and including through-holes communicating with the intake flow path,
wherein the arm body includes first and second ceramic plates, and an antistatic coating layer disposed on an external side of the first ceramic plate,
wherein the pad includes a first layer in contact with a substrate and having conductivity, a second layer disposed below the first layer, formed of a material having elasticity higher than that of the first layer and having conductivity, and a third layer disposed below the second layer and formed of a metal material having rigidity higher than that of the second layer,
wherein the first ceramic plate includes a connection groove connected to the pad, and
wherein a conductive portion connecting at least the third layer of the pad to the antistatic coating layer on an external side of the pad is provided.

16. The robotic arm of claim 15,
wherein the second layer is a conductive silicon layer,
wherein the third layer is a stainless steel layer or an aluminum layer, and
wherein the first and second ceramic plates include alumina.

17. The robotic arm of claim 15,
wherein the conductive portion includes a conductive adhesive connecting the pad to the antistatic coating layer, and
wherein the conductive portion is provided in a plurality of positions surrounding the pad.

18. The robotic arm of claim 17, further comprising:
an arm base connected to the arm body,
wherein the arm body includes a fastening hole, and the arm body and the arm base are bolted to each other.

19. The robotic arm of claim 18,
wherein the antistatic coating layer includes an adhesive portion in which the antistatic coating layer is not formed in the connection groove,
wherein the third layer is adhered to a portion of the adhesive portion through an adhesive,
wherein the conductive portion connects the antistatic coating layer and the third layer to the other portion of the adhesive portion, and
wherein the antistatic coating layer includes fluororesin.

* * * * *